METHOD FOR GROWING SEMICONDUCTOR CRYSTALS

Filed April 23, 1959

INVENTORS
Chester Cameron Allen
and William Nunley
BY Stevens, Davis, Miller & Mosher
ATTORNEYS

2,993,818
METHOD FOR GROWING SEMICONDUCTOR CRYSTALS

Chester Cameron Allen, Grapevine, and William Nunley, Richardson, Tex., assignors to Texas Instruments Incorporated, Dallas, Tex., a corporation of Delaware
Filed Apr. 23, 1959, Ser. No. 808,414
5 Claims. (Cl. 148—1.5)

This invention relates to methods for growing single crystal semiconductor crystals and more particularly to a method for growing single crystal semiconductor transistor crystals characterized by regions of high resistivity.

Grown junction transistors are well known in the prior art. Among the well known methods for producing grown junctions in semiconductor crystals are the growth rate control method, the double doped method, and the grown diffused method. However, these methods and the devices for use thereby have definite limitations and disadvantages. In some transistors, it is desirable to have a low collector saturation resistance with a high breakdown voltage across the junction between the collector and base regions. However, in most grown junction devices, it has been found that if the saturation resistance of the collector is maintained at a low value, the junction breakdown voltage will also be very low. Thus, in growning crystals using either the growth rate control method, the doubled doped method, or grown diffused method, it is necessary to compromise and choose the most nearly desirable breakdown voltage and collector saturation resistance which may be attained. However, neither of the two will be at an optimum value.

It is also well known that by placing a region having a relatively high resistivity adjacent the collector base junction, the collector saturation resistance may be maintained at a low value while still providing a high collector base junction breakdown voltage. The present invention provides a method for growing PN junction semiconductor crystals characterized by a layer of high resistivity material adjacent the collector base junction. By using the method of this invention, the transistor crystal may be grown in which the collector region has a satisfactorily low saturation resistance, but which possesses high breakdown voltage characteristics.

It is therefore one object of the present invention to provide a method for producing the region of high resistivity material adjacent a PN junction within a grown semiconductor crystal.

It is another object of the present invention to provide junction transistors having high breakdown voltage characteristics.

It is a further object of the present invention to provide a grown junction transistor having a relatively low collector saturation resistance.

Figure 1:
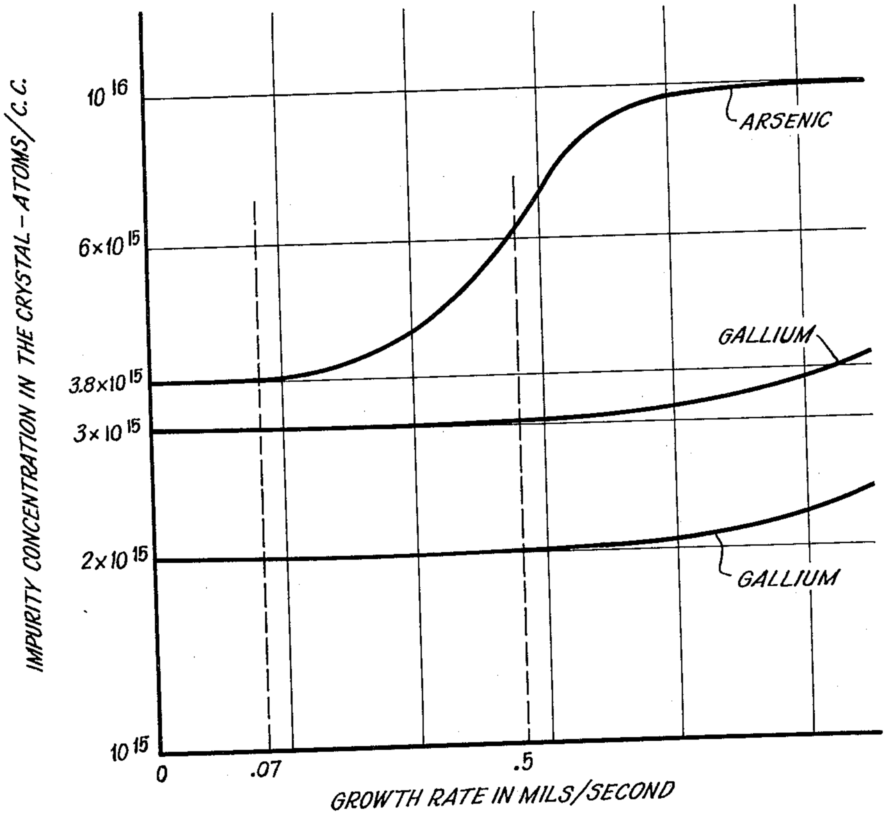
Figure 2:
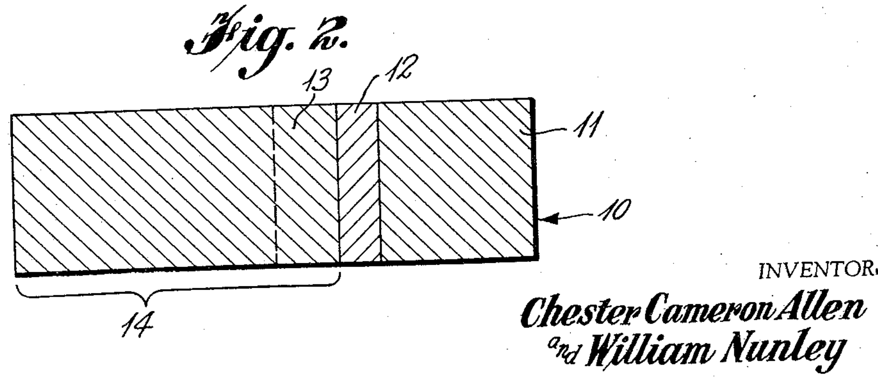

Other objects and further details of the invention are disclosed in the following detailed discussion and the accompanying drawing in which:

FIGURE 1 is a graph illustrating changes in the impurity concentration in a growing silicon crystal as the growth rate of the crystal is changed; and FIGURE 2 is a cross section view of a transistor bar produced from a crystal grown according to the method of the present invention.

In the practice of this invention, single crystal material is grown from a melt containing both P- and N-type impurities. In a crystal containing both P- and N-type impurities, the resistivity of the crystal is determined by the excess of one type impurity over the other type impurity. One of the impurities chosen will have a segregation coefficient which will vary only slightly as the growth rate of the crystal is changed over a predetermined range. The second impurity will be of such a character that the segregation coefficient will change over a relatively wide range as the growth rate is varied over a predetermined range. As a region of higher resistivity material is normally desired, the impurities which predominate in the crystal will be chosen to have the segregation coefficient which varies over the relatively wide range. The initial doping level is chosen to give a desired resistivity at a desired pull rate and the crystal is grown so as to give this desired resistivity. At such time as it is desired to add the region of high resistivity, the growth rate is decreased to a predetermined value. Due to the change in segregation coefficient of the predominant impurity, less of this predominant impurity will appear in the crystal and the resistivity of the crystal will be appreciably raised.

There are many variations of the above method. For instance, if the initial growth rate were the lower one, the resistivity would be decreased as the growth rate was increased. Also, if the impurity which predominated in the crystal was the one which exhibited only a small change in segregation coefficient as the growth rate was varied over a predetermined range, an increase in growth rate would increase the resistivity of the material. Furthermore, as the change in impurity concentration in the crystal for a certain change in growth rate will remain constant, the factor by which the resistivity in the crystal is changed may be controlled by controlling the initial concentrations of doping materials in the melt.

Referring now to FIGURE 1 of the drawing, a curve is plotted illustrating the manner in which the impurity concentration in a silicon crystal will vary as the growth rate in the crystal is varied, for a P-type conductivity impurity, gallium, and for a N-type conductivity impurity, arsenic. As the growth rate of the crystal is varied, the impurity concentration in the portion of crystal being grown will vary as the segregation coefficient of the individual impurity changes. It is to be observed that the impurity concentration of the gallium changes over a very narrow range as the growth rate is varied. On the other hand, the impurity concentration in the crystal of the arsenic is found to vary over a relatively wide range as the growth rate is changed.

Again observing the graph of FIGURE 1, it may be seen that by changing the growth rate of the crystal, the resistivity of the crystal being grown may be changed. The amount of change in resistivity is dependent on, and thus may be controlled by, variations in the growth rate of the crystal. For instance, as may be seen from FIGURE 1, with an initial growth rate of .5 mil per second, and the melt doped to obtain a concentration in the crystal of $2 \times 10^{15}$ impurity atoms per cubic centimeter of gallium and $6 \times 10^{15}$ impurity atoms per cubic centimeter of arsenic, the resistivity of the crystal being grown may be changed by a factor of approximately 2 by decreasing the growth rate from 0.5 mil per second to 0.07 mil per second. On the other hand, if the initial concentration in the melt of gallium is such as to give a concentration in the crystal of approximately $3 \times 10^{15}$ impurity atoms per cubic centimeter at a growth rate of 0.5 mil per second, the resistivity of the region formed when the growth rate is decreased to 0.07 mil per second will be approximately $4\times$ the resistivity of the material grown at a growth rate of 0.5 mil per second. Thus, by varying the relative impurity concentration, the pull rate, and the combination of impurities used, it is possible to achieve a relatively wide range of resistivities. Thus, this invention provides a means for growing a crystal having a layer of either higher or lower resistivity material. This layer may be of any desired width or of almost any desired resistivity.

If it is desired, a junction may be formed in the crystal adjacent the region of high resistivity by adding a sufficient quantity of the minority-type impurity. A second junction may then be formed by adding an additional amount of the impurity of the same type as predominates in the first part of the crystal grown. In the following specific example, a method for growing a silicon NPN transistor having a layer of high resistivity material adjacent the base collector junction is shown. However, it must be appreciated that the methods of this invention may be used for growing crystals for use in devices other than transistors and that materials other than silicon may be used.

Referring to FIGURE 2 of the drawing, there is shown a bar such as might be cut from a crystal grown according to this specific example. The bar 10 will consist of the N-type emitter region 11, the P-type base region 12, a collector region 14 having a region 13 of high resistivity N-type material adjacent the base-collector junction 15.

In growing the crystal from which this bar was cut, a 50 gram charge of pure silicon having a resistivity above 40 ohm-centimeters, either P- or N-type, was placed in the crucible of a crystal-puller, such as is well known in the art. The collector doping material, which comprised an alloy composed of .05% arsenic and .11% gallium and the remainder silicon, was placed in the crucible with the molten silicon. The quantity of doping material used was adjusted to obtain the desired collector resistivity. Using methods which are well known in the art, a seed crystal of single crystal silicon was placed in contact with the melt and slowly withdrawn, causing the crystal to grow. After the crystal was formed to a diameter of approximately 1.25 inches, the temperature was adjusted to obtain straight sides, and the crystal was grown at a rate of .5 mil per second. Using this pull rate, the collector portion of the crystal having a low resistivity, for example, about 1.5 ohm-centimeters, was grown.

After the collector portion of the crystal having low resistivity was grown, the temperature was raised approximately 35° C. to reduce the growth rate and the pull rate was reduced to 0.07 mil per second. The crystal was grown at a rate of 0.07 mil per second for approximately 5 minutes. During this period of time, the region 13, within the collector layer 14, of high resistivity material, for example, about 3 ohm-centimeters, was formed.

After the region 13 of high resistivity material was grown to the desired width, an additional amount of P-type impurity was added to the melt. In this specific embodiment, 20 milligrams of pure aluminum was added. Three to five seconds after the P-type dope, aluminum, was added to the melt, the N-type emitter dope was added. In this instance, the emitter dope comprised 50 milligrams of arsenic. The base layer was formed in the crystal in the interval of time between the addition of the P-type dope to the melt and the addition of the N-type emitter dope to the melt. The time between the dropping of the P-type base dope and the N-type emitter dope will determine the width of the base layer. After the arsenic was added to the melt, a period of time, which may be on the order of five minutes, was allowed for the arsenic to mix. The temperature was then decreased approximately 45° C. and the pull rate increased to 0.5 mil per second. The emitter region of the crystal was then grown at this temperature and pull rate. After the emitter region was grown, the crystal was removed from the melt and allowed to cool.

Transistors made from crystals grown using this method have been found to have a collector resistivity as low as 1.5 ohm-centimeter and a base width as low as .2 mil. These crystals have been found to have a breakdown voltage of over 120 volts. Thus, it may be seen that the method of this invention produces a transistor having greatly improved characteristics.

Although the present invention has been shown and described with reference to a particular embodiment, it will be appreciated that certain changes and modifications to one skilled in the art can be made, and that such changes and modifications should be deemed to fall within the spirit and scope of the appended claims.

What is claimed is:

1. The method for growing a PNP-type transistor crystal characterized by a layer of high resistivity P-type material adjacent the collector-base junction which comprises the steps of growing at a predetermined rate a first crystal region of low resistivity P-type conductivity from a melt containing both the P-type and N-type impurities wherein said P-type impurity predominates, said P-type impurity being of such a character that changes in crystal growth rate will cause relatively large changes in the segregation coefficient of said P-type impurity, changing the growth rate of said crystal to a fixed lower rate and maintaining the growth rate at said fixed lower rate while growing a second crystal region of high resistivity P-type conductivity, adding an additional quantity of N-type impurity to form a first P-N junction, and thereafter adding an additional quantity of P-type impurity to form a second P-N junction.

2. The method for growing a NPN-type transistor crystal characterized by a layer of high resistivity N-type material adjacent the collector-base junction which comprises the steps of growing at a predetermined rate a first crystal region of low resistivity N-type conductivity from a melt containing both P- and N-type impurities wherein said N-type impurity predominates, said N-type impurity being of such a character that changes in crystal growth rate will cause relatively large changes in the segregation coefficient of said N-type impurity, changing the growth rate of said crystal to a fixed lower rate and maintaining the growth rate at said fixed lower rate while growing a second crystal region of high resistivity N-type conductivity, adding an additional quantity of P-type impurity to form a first P-N junction, and thereafter adding an additional quantity of N-type impurity to form a second P-N junction.

3. The method of claim 2 wherein said transistor crystal is of silicon.

4. The method of claim 2 wherein said P- and N-type impurities comprise gallium and arsenic.

5. The method for growing a crystal of mostly low resistivity semiconductor material characterized by a rectifying junction having a region of relatively high resistivity material adjacent said junction which comprises the steps of growing at a predetermined rate a first region of a crystal of one-type conductivity from a melt containing both P- and N-type impurities, the predominant impurity being of such a character that changes in growth rate will cause relatively large changes in the segregation coefficient of said predominant impurity, changing the growth rate of said crystal to a fixed lower rate and maintaining the growth rate at said fixed lower rate while growing a second crystal region of said one-type conductivity and high resistivity, thereafter adding an excess of impurity producing a conductivity type opposite to that produced by said predominant impurity whereby a PN junction is formed in said crystal and thereafter growing a region of a conductivity type opposite said one type.

References Cited in the file of this patent

UNITED STATES PATENTS

| | | |
|---|---|---|
| 2,822,308 | Hall | Feb. 4, 1958 |
| 2,878,152 | Runyan | Mar. 17, 1959 |
| 2,889,240 | Rosi | June 2, 1959 |
| 2,892,739 | Rusler | June 30, 1959 |